United States Patent
Chebi et al.

(10) Patent No.: US 9,318,341 B2
(45) Date of Patent: Apr. 19, 2016

(54) METHODS FOR ETCHING A SUBSTRATE

(75) Inventors: Robert P. Chebi, San Carlos, CA (US); Alan Cheshire, Glasgow (GB); Gabriel Roupillard, Stockholm (SE); Alfredo Granados, San Antonio, TX (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 204 days.

(21) Appl. No.: 13/305,992

(22) Filed: Nov. 29, 2011

(65) Prior Publication Data

US 2012/0152895 A1 Jun. 21, 2012

Related U.S. Application Data

(60) Provisional application No. 61/425,021, filed on Dec. 20, 2010.

(51) Int. Cl.
*C23F 1/00* (2006.01)
*B44C 1/22* (2006.01)
(Continued)

(52) U.S. Cl.
CPC ...... *H01L 21/30655* (2013.01); *B81C 1/00619* (2013.01); *H01J 37/32403* (2013.01);
(Continued)

(58) Field of Classification Search
USPC ........ 118/723 I; 204/192.32, 298.04, 298.12; 216/100, 18, 2, 22, 37, 41, 67; 257/296, 306, 486, 748, 750, 756, 758, 257/760, 77, 774; 313/495; 365/148; 385/2; 428/195.1, 216, 432; 430/311, 313, 430/314, 318, 322, 326, 328, 5; 438/105, 438/197, 199, 201, 231, 243, 286, 296, 3, 438/424, 445, 458, 622, 631, 636, 637, 638, 438/639, 681, 689, 691, 694, 695, 696, 700, 438/701, 702, 703, 706, 710, 714, 717, 725, 438/73, 735, 789; 501/53; 65/386
See application file for complete search history.

(56) References Cited

U.S. PATENT DOCUMENTS 6,015,761 A * 1/2000 Merry et al. .................. 438/727
6,531,068 B2 3/2003 Laermer et al.
(Continued)

FOREIGN PATENT DOCUMENTS

CN 101800174 A 8/2010
JP 2010-185728 A 8/2010

OTHER PUBLICATIONS

International Search Report and Written Opinion mailed Jun. 1, 2012 for PCT Application No. PCT/US2011/065817.
(Continued)

*Primary Examiner* — Shamim Ahmed
(74) *Attorney, Agent, or Firm* — Mosher Taboada; Alan Taboada

(57) ABSTRACT

Methods for etching a substrate in a plasma etch reactor may include (a) depositing polymer on surfaces of a feature formed in substrate disposed in the etch reactor using first reactive species formed from a first process gas comprising a polymer forming gas; (b) etching the bottom surface of the feature of the substrate in the etch reactor using a third reactive species formed from a third process gas including an etching gas; and (c) bombarding a bottom surface of the feature with a second reactive species formed from a second process gas comprising one or more of an inert gas, an oxidizing gas, a reducing gas, or the polymer forming gas while at least one of depositing the polymer to remove at least some of the polymer disposed on the bottom surface or etching the bottom surface to at least one of chemically or physically damage the bottom surface.

20 Claims, 4 Drawing Sheets

(51) Int. Cl.
- *H01L 21/311* (2006.01)
- *H01L 21/3065* (2006.01)
- *B81C 1/00* (2006.01)
- *H01J 37/32* (2006.01)
- *H01L 21/67* (2006.01)
- *H01L 21/677* (2006.01)
- *H01L 21/683* (2006.01)

(52) U.S. Cl.
CPC .... *H01L21/67069* (2013.01); *H01L 21/67748* (2013.01); *H01L 21/6831* (2013.01); *B81B 2203/033* (2013.01); *B81C 2201/0112* (2013.01)

(56) References Cited

U.S. PATENT DOCUMENTS

| | | | |
|---|---|---|---|
| 6,632,322 B1 * | 10/2003 | Gottscho et al. | 156/345.33 |
| 6,784,108 B1 * | 8/2004 | Donohoe et al. | 438/706 |
| 6,979,652 B2 | 12/2005 | Khan et al. | |
| 7,244,313 B1 | 7/2007 | Zhou et al. | |
| 2001/0044213 A1 * | 11/2001 | Pandhumsoporn et al. | 438/712 |
| 2004/0072443 A1 * | 4/2004 | Huang et al. | 438/710 |
| 2005/0153538 A1 * | 7/2005 | Tsai et al. | 438/636 |
| 2005/0266691 A1 * | 12/2005 | Gu et al. | 438/706 |
| 2008/0093338 A1 | 4/2008 | Okune et al. | |
| 2010/0197138 A1 * | 8/2010 | Cheshire et al. | 438/694 |
| 2010/0308014 A1 | 12/2010 | Cheshire | |

OTHER PUBLICATIONS

Search Report from the State Intellectual Property Office of The People's Republic of China dated May 7, 2015 received for Chinese Application No. 2011800611419.

* cited by examiner

METHODS FOR ETCHING A SUBSTRATE

CROSS-REFERENCE TO RELATED APPLICATIONS

This application claims benefit of U.S. provisional patent application Ser. No. 61/425,021, filed Dec. 20, 2010, which is herein incorporated by reference.

BACKGROUND

1. Field

Embodiments of the present invention generally relate to methods for etching a substrate.

2. Description of the Related Art

Some etch reactors employ a cyclical etch process that includes several recipe steps, such as etch and deposition, or etch, flash, and deposition. The cyclical etch process may use a time multiplexed gas modulation ("TMGM") system or a Bosch system to sequentially provide etchants and deposition species. The deposition species provide a protective film upon the previously etched surface to protect the surface, typically the sidewalls of the trench, from further etching. These two steps are repeated as a deeper and deeper trench is formed. Poor control of the cyclical etch process disadvantageously increases the roughness of the sidewalls, which may render a microelectronic device defective.

Further, deposition of the deposition species is not well controlled and can result in the deposition species being deposited on a surface to be etched. Accordingly, either an additional process step must be included to remove the deposition species from the surface to be etched, or an etch step must proceed for a longer duration to first remove the deposition species to reach the surface to be etched. Therefore, poor control of the deposition species can result in a longer duration for the cyclical etch process.

Therefore, improved methods for etching a substrate are provided herein.

SUMMARY

Methods and apparatus for etching a substrate are provided herein. In some embodiments, a method for etching a substrate in a plasma etch reactor may include (a) depositing a polymer on surfaces of a feature formed in a substrate disposed in the etch reactor using a first reactive species formed from a first process gas comprising a polymer forming gas; (b) etching the bottom surface of the feature of the substrate in the etch reactor using a third reactive species formed from a third process gas including an etching gas; and (c) bombarding a bottom surface of the feature with a second reactive species formed from a second process gas comprising one or more of an inert gas, an oxidizing gas, a reducing gas, or the polymer forming gas while at least one of depositing the polymer to remove at least some of the polymer disposed on the bottom surface or etching the bottom surface to at least one of chemically or physically damage the bottom surface. In some embodiments, the method may further include repeating (a), (b) and (c) until the feature is etched into the substrate to a predetermined depth.

Other and further embodiments of the present invention are described below.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
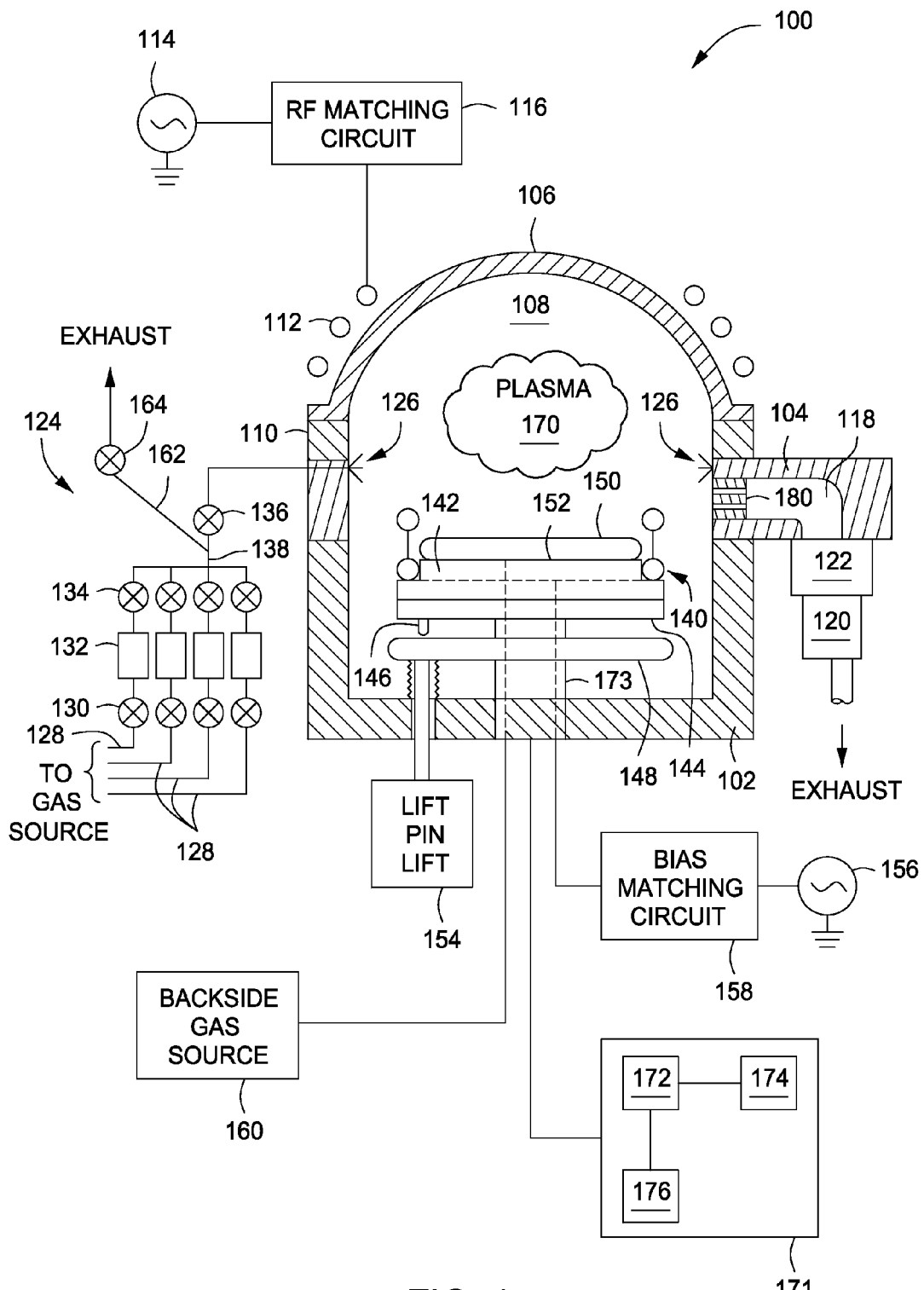
FIG. 1 depicts a sectional schematic of a substrate etching reactor in accordance with some embodiments of the present invention.

To facilitate understanding, identical reference numerals have been used, where possible, to designate identical elements that are common to the figures. It is to be noted, however, that the appended drawings illustrate only typical embodiments of this invention and are therefore not to be considered limiting of its scope, for the invention may admit to other equally effective embodiments.

DETAILED DESCRIPTION

Methods and apparatus for etching a substrate are disclosed herein. Although the apparatus and methods described herein are particularly advantageous for etching silicon for MEMS applications, it is contemplated that the embodiments of the invention are not limited to use in MEMS application or with silicon etching, but may be beneficially utilized to etch other types of materials and/or be utilized in other etch reactors. The inventive methods disclosed herein may advantageously provide a reduced duration for etching a feature in a substrate. The inventive methods disclosed herein may advantageously provide smoother surfaces of an etched feature.

FIG. 1 depicts a sectional view of an etch reactor 100 in accordance with some embodiments of the present invention. The etch reactor 100 includes a lower chamber body 102, an upper chamber body 104, and a ceiling 106 which enclose a process volume 108. The ceiling 106 may be flat or have other geometry. In one embodiment, the ceiling 106 is a dome. An interchangeable spacer 110 is provided between the ceiling 106 and the upper chamber body 104 so that the inclination and/or height of the ceiling 106 relative to the upper chamber body 104 may be selectively changed as desired.

An RF coil 112 is disposed above the ceiling 106 and coupled to an RF source 114 through a matching circuit 116. The ceiling 106 is transmissive to the RF power such that source power applied to the coil 112 from the RF source 114 may be inductively coupled to and energize gases disposed in the process volume 108 of the reactor 100 to maintain a plasma 170. Conventionally, the power applied to the coil 112 is known as source power.

The source power may be provided at a radio frequency within a range from about 2 MHz to about 60 MHz at a power within a range from about 10 watts to about 5000 watts. The source power may be pulsed.

The upper chamber body 104 includes a pumping channel 118 that connects the process volume 108 of the reactor 100 to a pump 120 through a throttle valve 122. The pump 120 and throttle valve 122 may be operated to control the pressure within the process volume 108 of the reactor 100. The pump 120 also removes etch by-products. A baffle plate 180 may be disposed in the pumping channel 118 to minimize contamination of the pump 120 and to improve conductance within the process volume 108.

The reactor 100 has a fast gas exchange system 124 coupled thereto that provides process and/or other gases to the process volume 108 through nozzles 126 positioned around the interior of the upper chamber body 104 or other suitable location. The fast gas exchange system 124 selectively allows any singular gas or combination of gases to be provided to the process volume 108. In some embodiments, the fast gas exchange system 124 has four delivery lines 128, each coupled to a different gas source. The delivery lines 128 may be coupled to the same or different nozzles 126.

In the embodiment depicted in FIG. 1, each delivery line 128 includes a first valve 130, a mass flow meter 132, and a second valve 134. The second valves 134 are coupled to a common tee 138, which is coupled to the nozzles 126. The conduits through which gases flow from mass flow meters 132 to the process volume 108 is less than about 2.5 m in length, thereby allowing faster switching times between gases. The fast gas exchange system 124 may be isolated from the process volume 108 of the reactor 100 by an isolation valve 136 disposed between the tee 138 and nozzles 126.

An exhaust conduit 162 is coupled between the isolation valve 136 and the tee 138 to allow residual gases to be purged from the fast gas exchange system 124 without entering the reactor 100. A shut off valve 164 is provided to close the exhaust conduit 162 when gases are delivered to the process volume 108 of the reactor 100.

The gas sources coupled to the fast gas exchange system 124 may provide gases, including but not limited to, sulfur hexafluoride ($SF_6$), oxygen ($O_2$), argon (Ar), trifluoromethane ($CHF_3$), octafluorocyclobutane ($C_4F_8$), nitrogen trifluoride ($NF_3$), carbon tetrafluoride ($CF_4$), trifluoromethane ($CHF_3$), chlorine trifluoride ($ClF_3$), bromine trifluoride ($BrF_3$), iodine trifluoride ($IF_3$), helium-oxygen gas ($HeO_2$), helium-hydrogen gas ($HeH_2$), hydrogen ($H_2$), helium (He), and/or other gases for use in the processes as described herein. The flow control valves may include pneumatic operation to allow rapid response. In one example, the fast gas exchange system 124 is operable to deliver $SF_6$ and $C_4F_8$ at up to about 1000 sccm, helium at about 500 sccm, and oxygen ($O_2$) and argon at about 200 sccm. In an alternative embodiment, the fast gas exchange system 124 may further include a third gas panel comprising of a plasma sustaining gas, such as argon and/or He, and operable to continuously deliver the gas to the reactor 100 during the cyclical etching method described further below.

The etch reactor 100 additionally includes a substrate support assembly 140 is disposed in the process volume 108. The substrate support assembly 140 includes an electrostatic chuck 142 mounted on a thermal isolator 144. The thermal isolator 144 insulates the electrostatic chuck 142 from a stem 173 that supports the electrostatic chuck 142 above the bottom of the lower chamber body 102.

Lift pins 146 are disposed through the substrate support assembly 140. A lift plate 148 is disposed below the substrate support assembly 140 and may be actuated by a lift 154 to selectively displace the lift pins 146 to lift and/or place a substrate 150 on an upper surface 152 of the electrostatic chuck 142.

The electrostatic chuck 142 includes at least one electrode (not shown) which may be energized to electrostatically retain the substrate 150 to the upper surface 152 of the electrostatic chuck 142. An electrode of the electrostatic chuck 142 is coupled to a bias power source 156 through a matching circuit 158. The bias power source 156 may selectively energize the electrode of the electrostatic chuck 142 to control the directionality of the ions during etching.

The bias power applied to the electrostatic chuck 142 by the bias power source 156 may be pulsed, e.g. repeatedly storing or collecting the energy over a time period and then rapidly releasing the energy over another time period to deliver an increased instantaneous amount of power, while the source power may be continuously applied. In particular, the bias power may be pulsed using generator pulsing capability set by a control system to provide a percentage of time that the power is on, which is referred to as the duty cycle. In one embodiment, the time on and the time off of a pulsed bias power may be uniform throughout the etching cycles. For example, if the power is on for about 3 msec and off for about 15 msec, then the duty cycle would be about 16.67%. The pulsing frequency in cycles per second or hertz (Hz) is equal to 1.0 divided by the sum of the on and off time periods in seconds. For example, when the bias power is on for about 3 msec and off for about 15 msec, for a total of about 18 msec, then the pulsing frequency in cycles per second is about 55.55 Hz. In one embodiment, a specialized pulsing profile where the on/off timing changes during the etching cycles may be used. In one embodiment, by changing the bias power applied to the substrate, the etching cycle may switch between the deposition and/or etching steps. The bias power is pulsed to help reduce scalloping of the trench sidewalls, improve resist selectivity, improve the etch rate, and prevent material interface notching.

Figure 2:
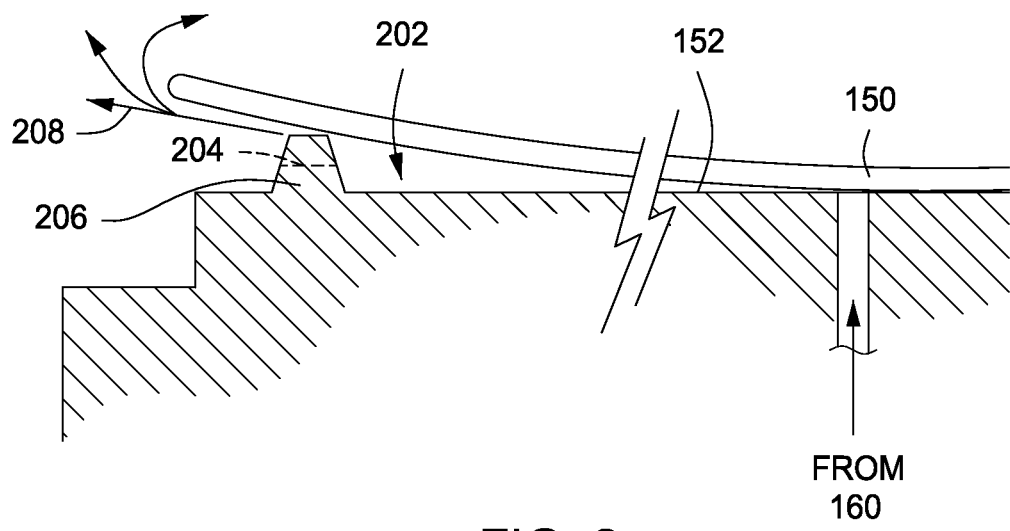
FIG. 2 depicts a partial sectional schematic of a substrate support assembly in accordance with some embodiments of the present invention.

Optionally, and referring additionally to FIG. 2, in some embodiments a backside gas source 160 may be coupled through the substrate support assembly 140 to provide one or more gases to a space 202 defined between the substrate 150 and the upper surface 152 of the electrostatic chuck 142. Gases provided by the backside gas source 160 may include He and/or a backside process gas. The backside process gas is a gas delivered from between the substrate and the substrate support which affects the rate of etch or polymerization during the etch cycle by reacting with the materials in the chamber, such as process gases, etch by-products, mask or other layers disposed on the substrate or the material targeted for etching. In some embodiments, the backside process gas is an oxygen containing gas, such as $O_2$. In some embodiments, a ratio of He to $O_2$ in the backside gas is about 50:50 to about 70:30 by volume or by mass for silicon etch applications. It is contemplated that other backside process gases may be utilized to control the processes near the edge of the substrate. The use of backside process gases may be used beneficially for single step etch processes as well as cyclical etch processes.

To enable the process gas provided by the backside gas source 160 to reach the edge of the substrate 150, the rate of backside gas leakage from under the edge of the substrate 150 is higher than that of conventional backside gas systems. In some embodiments, the leak rate may be elevated by maintaining the pressure of the gases in the space 202 between the substrate 150 and the upper surface 152 of the electrostatic chuck 142 between about 4 and 26 Torr. In some embodiments, the pressure may be maintained between about 10 and 22 Torr. In some embodiments, the pressure may be maintained between about 14 and 20 Torr. The leak rate (shown by arrows 208) may also be achieved by providing notches (204 shown in phantom) or other features in a lip 206 supporting the substrate 150 and the upper surface 152 of the electrostatic chuck 142 which promotes leakage of the backside gas between the electrostatic chuck 142 and the substrate 150.

Returning to FIG. 1, the etch reactor 100 may further include a controller 171 which generally comprises a central processing unit (CPU) 172, a memory 174, and support circuits 176 and is coupled to and controls the etch reactor 100 and various system components, such as the RF source 114, fast gas exchange system 124 and the like, directly (as shown in FIG. 1) or, alternatively, via other computers or controllers (not shown) associated with the process chamber and/or the support systems. The controller 171 may be one of any form of general-purpose computer processor that can be used in an industrial setting for controlling various chambers and sub-processors. The memory, or computer-readable medium, 174 of the CPU 172 may be one or more of readily available memory such as random access memory (RAM), read only memory (ROM), floppy disk, hard disk, or any other form of digital storage, local or remote. The support circuits 176 are coupled to the CPU 172 for supporting the processor in a conventional manner. These circuits include cache, power supplies, clock circuits, input/output circuitry and sub-systems, and the like. Inventive methods as described herein (such as the method 300 described below) may be stored in the memory as software routine. The software routine, when executed by the CPU 172, transforms the general purpose computer into a specific purpose computer (controller) 178 that controls the operation of the reactor 100 in the manner described herein. The software routine may also be stored and/or executed by a second CPU (not shown) that is remotely located from the hardware being controlled by the CPU 172 of the controller 174.

Figure 3:
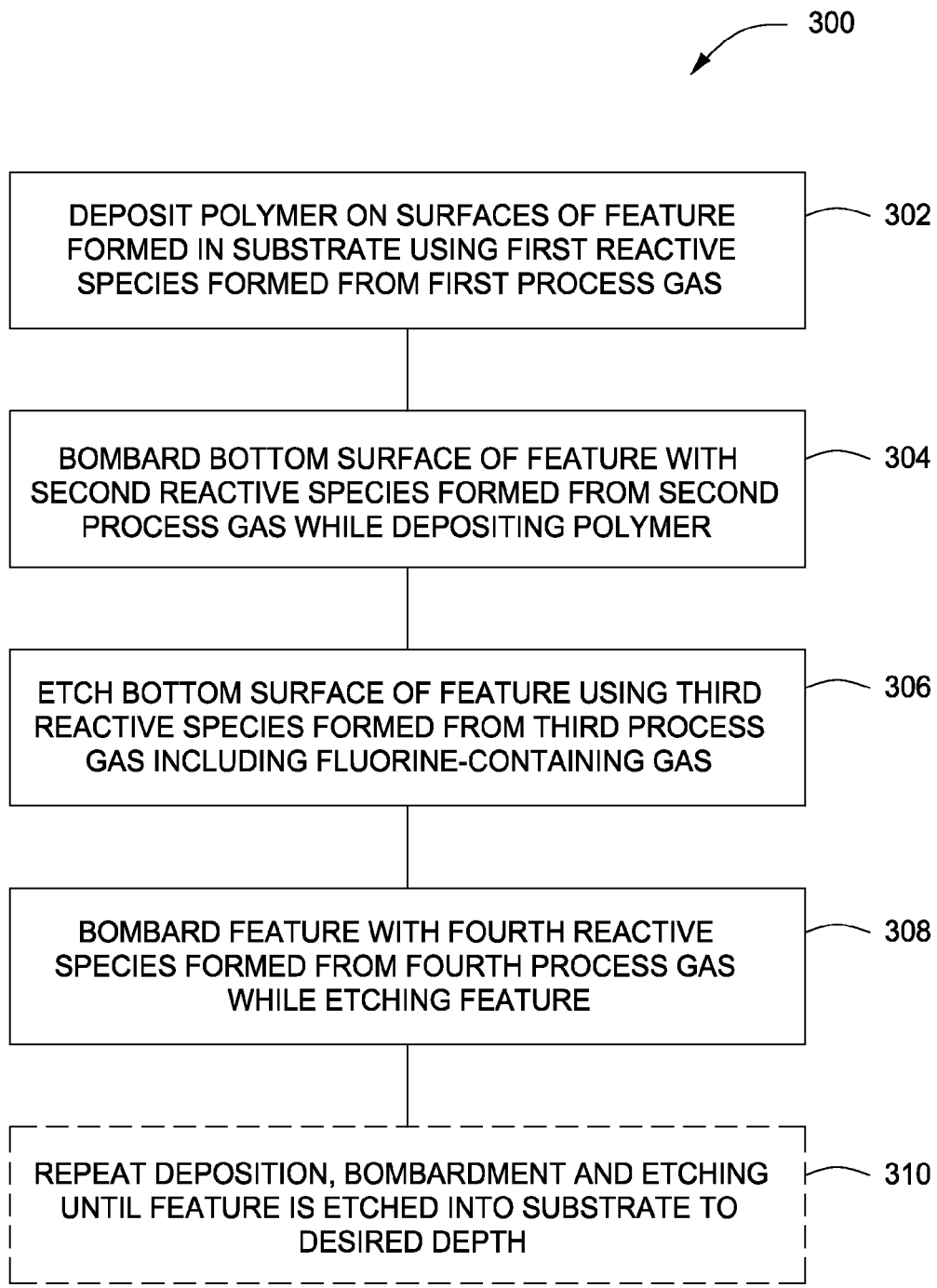
FIG. 3 depicts a flow chart for a method of etching a substrate in accordance with some embodiments of the present invention.
Figure 4A:
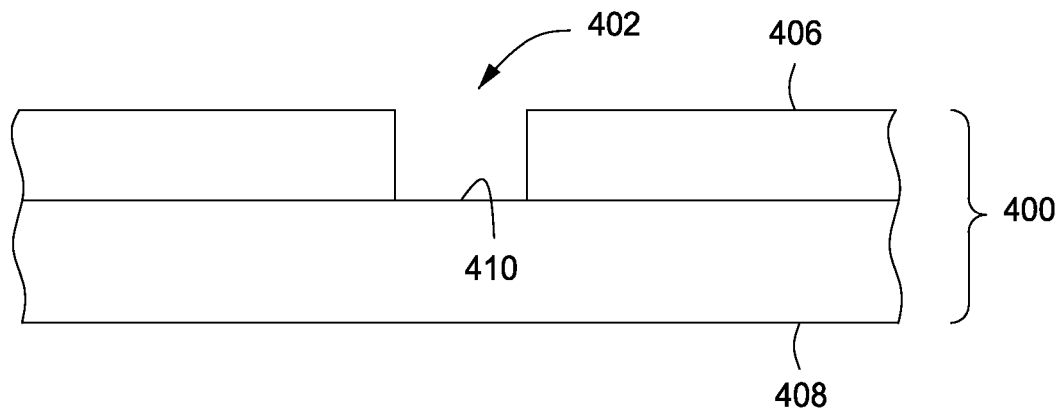
FIGS. 4A-C depict stages of etching a substrate in accordance with some embodiments of the present invention.
Figure 4B:
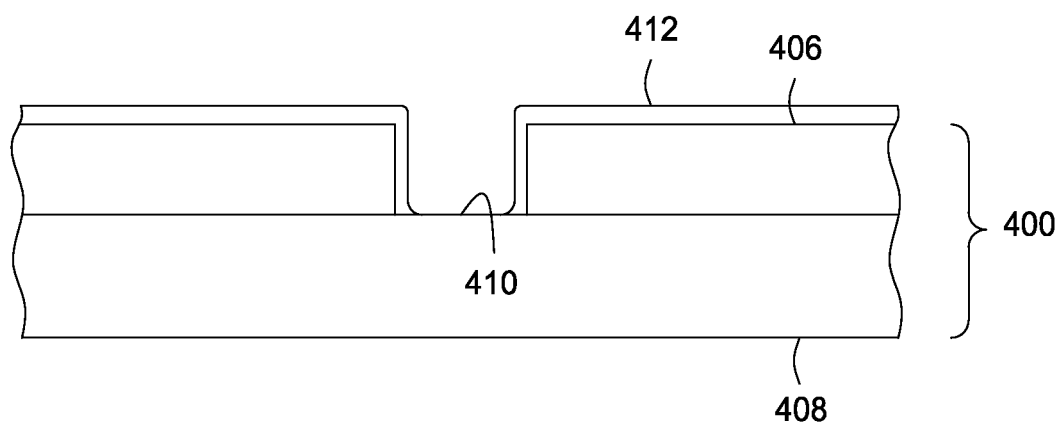
Figure 4C:
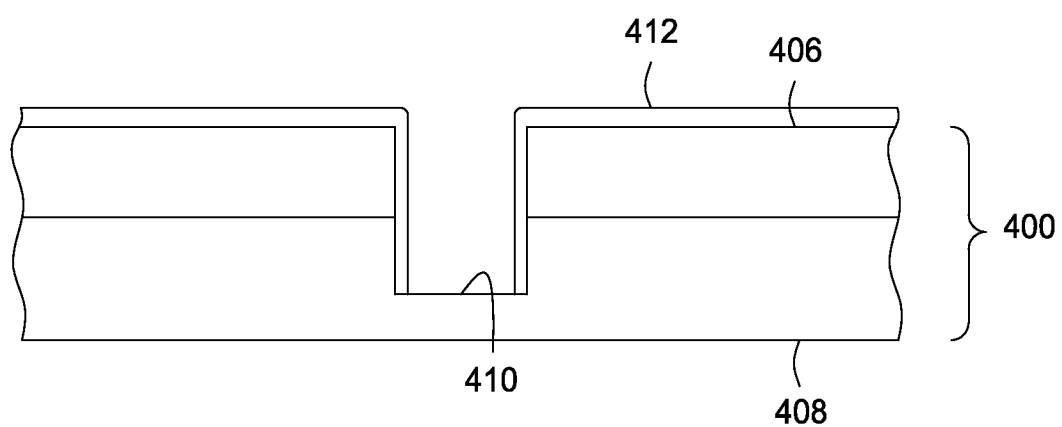

FIG. 3 depicts a flow chart for a method 300 for etching a substrate in accordance with some embodiments of the present invention. The method 300 may be practiced in the etch reactor 100, or other suitable etch reactors. The method 300 is described below in accordance with stages of etching a substrate as illustrated in FIGS. 4A-C. The method 300 begins by providing a substrate 400, for example, to the etch reactor 100, or a similar etch reactor capable of performing the method 300.

As illustrated in FIG. 4A, the substrate 400 may include a feature 402 formed in the substrate 400. For example, the feature 402 may be any one or more of a number of features, such as a trench, a via, a pattern in a masking layer or the like. The substrate 400 can be a single layer (not shown), or a combination of layers as illustrated. For example, the substrate 400 may comprise a first layer 406 having the feature 402 formed therein and a second layer 408 disposed below the first layer 406. As illustrated in FIG. 4A, the second layer may include a bottom surface 410 of the feature 402. In some embodiments, the first layer 406 may be a masking layer, such as a photoresist, hard mask, or other suitable masking layer. In some embodiments, the second layer 406 may comprise material to be etched (e.g., a material into which the feature is to be extended), such as a semiconductor material. For example, the second layer may be a silicon-containing layer, a predominantly silicon-containing layer, a doped-silicon layer, a substantially pure silicon layer (e.g., greater than about 95 atomic percent silicon), or any suitable semiconductor material-containing layer.

At 302, a polymer 412 may be deposited on the surfaces of the feature 402. For example, the polymer 412 may be deposited using a first reactive species formed from a first process gas comprising a polymer forming gas. In some embodiments, the first process gas comprises a fluorocarbon gas, such as at least one of a fluorocarbon, a hydrofluorocarbon (HFC) or a perfluorocarbon (PFC). In some embodiments, the fluorocarbon gas may comprise one or more of octafluorocyclobutane ($C_4F_8$), octafluoropropane ($C_3F_8$), hexafluorobutadiene ($C_4F_6$), pentafluoroethane ($C_2HF_5$), hexafluoroethane ($C_2F_6$), trifluoromethane ($CHF_3$), tetrafluoroethylene ($C_2F_4$), carbon tetrafluoride ($CF_4$), or tetrafluoroethane ($C_2H_2F_4$). The first process gas may further include an inert gas, such as argon (Ar) or the like. The first process gas may be co-flowed or pulsed with other process gases, such as a second process gas as discussed below.

For example, in some embodiments, during the polymer deposition at 302, $C_4F_8$ may be provided into the process volume 108 of the etch reactor 100 at a rate of between about 100 to about 500 sccm, for example, between about 150 to about 450 sccm, while maintaining chamber pressure at about 60 to about 120 mTorr, for example, about 85 mTorr. RF power may be applied to the coil 112 to maintain a plasma formed from the process gas. In some embodiments, the RF power applied to the coil 112 may be about 1000 to about 3000 watts, for example, between about 1500 to about 2500 watts. RF bias may be applied to the electrode of the electrostatic chuck 142 to promote deposition using one of a power control mode or a voltage control mode. For example, the controller 171 may be programmed to provide the desired control mode. In some embodiments, RF bias power may be provided by the bias power source 156 to the electrode of the electrostatic chuck 142 between about 1 to about 500 watts, for example, between about 70 to about 350 watts. In some embodiments, RF bias voltage may be provided by the bias power source 156 to the electrode of the electrostatic chuck 142 between about 15 to about 400 Volts. The RF bias may be pulsed or applied as continuous duty. The duration of the deposition process at 302 may be about 1.0 to about 5.0 seconds, for example, about 1.0 to about 3.0 seconds.

At 304, the bottom surface 410 of the feature 402 may be bombarded with a second reactive species while depositing the polymer at 302 to prevent substantial buildup of the polymer on the bottom surface 410 (e.g., to remove at least some of the polymer deposited on the bottom surface). For example, buildup of the polymer 412 on the bottom surface 410 may be undesirable because it may slow etching of the bottom surface 410 by an etching process at 306 as discussed below. The second reactive species may be formed from a second process gas, where the second process gas includes one or more of an inert gas, an oxidizing gas or a reducing gas. The second process gas may be flowed continuously with the first process gas used at 302, or pulsed with the first process gas during the deposition of the polymer 412. For example, "pulsed" as discussed herein can mean periodically injecting one or more second process gases to form one or more second reactive species to remove at least some of the polymer from the bottom surface 410 while continuously flowing the first process gas to deposit the polymer 412, or alternatively pulsing the first and second process gases to deposit the polymer 412. Exemplary non-limiting process schemes utilizing both embodiments at 302 and 304 are discussed below.

Exemplary oxidizing gases include oxygen-containing gases such as one or more of oxygen (O2), carbon dioxide (CO2), sulfur dioxide (SO2), or the like. Exemplary reducing gases include hydrogen-containing gases, such as one or more of hydrogen (H2), helium-hydrogen gas (HeH2), or the like. In some embodiments, the second process gas may comprise oxygen (O2) and argon (Ar). In some embodiments, the second reactive species may comprise oxygen ions and argon ions. For example, the second reactive species can physically and/or chemically react with the polymer deposited on the bottom surface 410 to form volatile species which can be exhausted from the process volume 108. For example, a second reactive species formed from a second process gas including an inert gas, such as argon, may physically react with the polymer, for example to create dangling bonds, increase surface area, or the like. For example, a second reactive species formed from a second process gas including one of a oxidizing gas or reducing gas, may chemically react with the polymer to form volatile species with can be exhausted from the process volume 108. For example, in some embodiments, a second reactive species having both physically reactive and chemically reactive species may be desirable to maximize removal of the polymer.

For example, in some embodiments, during the polymer deposition at 302, a second process gas including $O_2$ and Ar may be co-flowed or pulsed with the first process gas used to deposit the polymer at 302 into the process volume 108 of the etch reactor 100 at a rate of between about 100 to about 300 sccm, for example, between about 150 to about 250 sccm, while maintaining chamber pressure at about 30 to about 250 mTorr, for example, about 60 mTorr. For example, in some embodiments, $O_2$ may be flowed at a rate of between about 1 to about 205 sccm, for example, between about 1 to about 55 sccm. RF power may be applied to the coil 112 to maintain a plasma formed from the first process gas. In one embodiment, the RF power applied to the coil 112 is about 1000 to about 3000 watts, for example, between about 1500 to about 2500 watts. RF bias may be applied to the electrode of the electrostatic chuck 142 to promote deposition using one of a power control mode or a voltage control mode. For example, the controller 171 may be programmed to provide the desired control mode. In some embodiments, RF bias power may be provided by the bias power source 156 to the electrode of the electrostatic chuck 142 between about 100 to about 500 watts, for example, between about 150 to about 350 watts. In some embodiments, RF bias voltage may be provided by the bias power source 156 to the electrode of the electrostatic chuck 142 between about 15 to about 500 volts, for example, between about 100 to about 400 volts. The RF bias power may be pulsed or applied as continuous duty. The duration of the bombardment at 304 may be similar to the deposition process at 302 if co-flow of the first and second process gases is utilized. Alternatively, if a modulated scheme is utilized, the duration of each bombardment at 304 may be about 5 to about 50 percent of the duration of the deposition process, for example, about 10 to about 30 percent. As this duration is provided in a modulated manner, the above percentages may be considered as a duty cycle (e.g., a cycle defined by an on period followed by an off period, which may be repeated, where the duty cycle percentage is equal to the on time divided by the total cycle time).

Exemplary, non-limiting process schemes utilizing both embodiments of 302 and 304 during the deposition of the polymer 412 are discussed below. For example, in some embodiments, a process scheme may include modulating the first process gas with the second process, such as modulating a first process gas comprising $C_4F_8$ with a second process gas comprising Ar and $O_2$. For example, $C_4F_8$ may be provided for about 2 seconds. During the 2 second duration of $C_4F_8$, Ar and $O_2$ may be provided in pulses at a 50% duty cycle, for example, about 0.5 seconds "off" and about 0.5 seconds "on". For example, in some embodiments, a process scheme may include modulating the second process gas with the first process gas, such as modulating a second process gas comprising Ar and $O_2$ with a first process gas comprising $C_4F_8$. For example Ar and $O_2$ may be provided for about 2 seconds. During the 2 second duration of Ar and $O_2$, $C_4F_8$ may be provided at a 50% duty cycle, for example, about 0.5 seconds "off" and about 0.5 seconds "on". Alternatively, the first and second process gases may be alternately pulsed or provided in any suitable process scheme such that the polymer 412 is deposited on all but the bottom surface 410 of the feature 402.

At 306, the bottom surface 410 of the feature 402 may be etched using a third reactive species formed from a third process gas. The third process gas may include an etching gas, such as a halogen-containing gas, for example a fluorine-containing gas (e.g., when etching silicon). Suitable fluorine-containing gases may include $SF_6$, $NF_3$, $CF_4$, $CHF_3$, $ClF_3$, $BrF_3$, $IF_3$, or derivatives thereof. In some embodiments, the fluorine-containing gas includes sulfur hexafluoride ($SF_6$). In some embodiments, the third process gas may further comprise an inert gas, such as argon (Ar) or the like.

At 308, the feature 402 including the bottom surface 410 may be bombarded with a fourth reactive species formed from a fourth process gas while etching at 306 or sequentially with the etching step at 306 for any of a combination of reasons. The fourth reactive species and fourth process gas may comprise the second reactive species and second process gas, as discussed above with respect bombardment during the deposition process, and in some embodiments, may alternatively or further include the deposition gas. For example, the bombardment with the fourth reactive species may be utilized to physically and/or chemically damage the exposed bottom surface 410 to improve etch rate. For example, chemically damage can mean the creation of dangling bonds on the surface to be etched or a chemical reaction with the surface to create a surface that is etched at a faster rate than the existing surface. For example, an inert gas may be used to create dangling bonds. An oxidizing gas may be used to chemically react with any polymer deposited on the bottom surface of the feature. A reducing gas, such as a hydrogen containing gas may be utilized to chemically react with a surface, such as a silicon containing surface, to create a silicon hydride or the like which may be etched at a faster rate. The reducing gas may also be used to react with any polymer deposited on the bottom of the feature. Alternatively, or in combination, for example, the bombardment with the fourth reactive species may be utilized to deposit a polymer layer on newly etched sidewalls of the feature to limit one or more of undercutting or notching in the etched feature. As disclosed herein, undercutting may, for example, refer to undesirable etching of the feature 402 such that a second portion of the feature 402 etching into the second layer 408 has a critical dimension that exceeds that of a first portion of the feature 402 defined in the first layer 406. For example, a common scenario where undercutting may be relevant is when the first layer 406 is a masking layer and the second layer is a substrate or layer into which a pattern is being etched. Undercutting may occur due to isotropic etching of the second layer 408 if the newly etched sidewalls of the feature 402 are not protected with a polymer layer as illustrated in FIG. 4C.

Similarly, scalloping or notching may occur for similar reasons as undercutting, however, as disclosed herein, scalloping or notching refers to the surface roughness of the newly etched surfaces of the feature 402 in the second layer 408. For example, as the etching of the bottom surface proceeds, the newly created sidewalls of the etch front may not have polymer 412 covering these sidewalls. Accordingly, the third reactive species may attack the sidewalls. Over several repetitions or iterations of the processes at 302, 304, 306, and 308 the sidewalls may have a scalloped structure on the surfaces of the sidewalls of the feature. The surface roughness due to this scalloped structure is undesirable and can result in device failure. Accordingly, and for example, to limit the degree of surface roughness as etching proceeds, the fourth process gas may further comprise the polymer forming gas, such as a fluorocarbon gas, for example $C_4F_8$, to deposit polymer on the freshly etched sidewalls. For example, the other components of the polymer process gas, such as the etching gas, the inert gas, and the at least one of the oxidizing or reducing gas may be co-flowed or alternately flowed with the polymer forming gas similarly as described above.

The fourth reactive species may be formed from the fourth process gas, where the fourth process gas includes one or more of the first or second process gases as discussed above. For example, the fourth process gas may include one or more of a polymer forming gas, an inert gas, a reducing gas or an oxidizing gas. The fourth process gas may be flowed continuously with the third process gas used at 306, or pulsed with the third process gas during the etch of the bottom surface 410. For example, in some embodiments, the fourth process gas may include an inert gas and at least one of an oxidizing gas or a reducing gas. In some embodiments, the fourth process gas may comprise $O_2$ and Ar. Alternatively or in combination with the inert gas and at least one of an oxidizing gas or a reducing gas, the fourth process gas may further comprise a polymer forming gas, such as a fluorocarbon gas. In some embodiments, the fourth process gas may further comprise $C_4F_8$. The at least one of an oxidizing or a reducing gas may be utilized similarly as described above at 304 to remove at least some polymer that may be deposited on the bottom surface 410 of the feature 402 as the bottom surface is etched, and/or to chemically damage the exposed bottom surface to facilitate an improved etch rate. The inert gas at 308 may serve a similar purpose to the inert gas at 304, which may be to allow for a fast transition between deposition and etching steps, and/or to physically damage the exposed bottom surface to facilitate an improved etch rate.

For example, in some embodiments, during the etching of the bottom surface 410 at 306, $SF_6$ may be provided to etch the bottom surface 410. $SF_6$ may be provided into the process volume 108 of the etch reactor 100 at a rate of between about 50 to about 500 sccm, for example, between about 150 to about 350 sccm, while maintaining chamber pressure at about 30 to about 250 mTorr, for example, about 100 mTorr. Optionally, $O_2$ may be co-flowed or alternately flowed with $SF_6$ at a rate of between about 1 to about 20 sccm, for example, between about 1 to about 5 sccm. Optionally, Ar may be co-flowed or alternately flowed with $SF_6$ at a rate of between about 50 to about 300 sccm, for example, between about 100 to about 200 sccm. Optionally, or alternatively to $O_2$ and Ar, $C_4F_8$ may be co-flowed or alternately flowed with $SF_6$. In some embodiments, $C_4F_8$ may be co-flowed or alternately flowed with $SF_6$ at a rate of between about 5 to about 200 sccm, for example, between about 25 to about 150 sccm. RF power may be applied to the coil 112 to maintain a plasma formed from the second process gas. In one embodiment, the RF power applied to the coil 112 is about 1000 to about 3000 watts, for example, between about 1500 to about 2500 watts. RF bias may be applied to the electrode of the electrostatic chuck 142 to promote deposition using one of a power control mode or a voltage control mode. For example, the controller 171 may be programmed to provide the desired control mode. In some embodiments, RF bias power may be provided by the bias power source 156 to the electrode of the electrostatic chuck 142 between about 100 to about 500 watts, for example, between about 150 to about 350 watts. In some embodiments, RF bias voltage may be provided by the bias power source 156 to the electrode of the electrostatic chuck 142 between about 15 to about 500 volts, for example, between about 100 to about 400 volts. The RF bias power may be pulsed or applied as continuous duty. The duration of the bombardment at 308 may be similar to the etching process at 306 if co-flow of the third and second process gases is utilized. Alternatively, if a modulated scheme is utilized, the duration of each bombardment at 308 may be about 5 to about 50 percent of the duty cycle, for example, about 10 to about 30 percent.

Exemplary process schemes utilizing both embodiments of 306 and 308 during the etching of the bottom surface 410 are discussed below. For example, in some embodiments, a process scheme may include modulating the third process gas with the fourth process, such as modulating a third process gas comprising $SF_6$ and Ar with a fourth process gas comprising $O_2$. For example, $SF_6$ and Ar may be provided for about 4 seconds. During the 4 second duration of $SF_6$ and Ar, $O_2$ may be provided at about a 12.5% duty cycle, for example, about 0.5 seconds "on" and about 3.5 seconds "off". Alternatively, the third and fourth process gases may be alternately pulsed or provided in any suitable process scheme such that the bottom surface 410 of the feature 402 is etched while scalloping or undercutting is limited. In some embodiments, the polymer forming gas could be used as part of the fourth process gas, for example, the polymer forming gas may be pulsed on for about 0.5 to about 1 seconds, then off for the remainder of the period, or, alternatively, gradually reducing the flow of the polymer forming gas from a first rate (for example, about 70 sccm) to zero over a period of time as the etch progresses.

At 310, the processes at 302, 304, 306, and 308 may be repeated. For example, rapid switching between any of 302, 304, and 306 may be augmented by the use of the mass flow controller in the fast gas exchange system 124 having response times in the range of 100 ms. Faster switching between steps 302, 304, 306, and 308 results in faster etch rates and less scalloping of the feature sidewalls. For example, as illustrated in FIG. 4C, as the bottom surface 410 is etched, repetition of the step 302 results in an extension of the polymer 412 along the freshly etched sidewalls of the feature 402. The repetition of the step 302 may limit etching of the feature 402 beyond the desired critical dimension of the feature 402. The repetition of steps 302, 304, 306, and 308 may occur in any desired sequence to achieve a desired depth in the etched feature. For example, the repetition may be sequential, such as 302, 304, 306 and 308 followed again by 302, 304, 306, and 308. Alternatively, the repetition may be in any desired sequence or using any desired combination of process gases as discussed above. Other variations of the repeat process are possible in accordance with the embodiments of each step 302, 304, 306 and 308 as disclosed herein.

While the foregoing is directed to embodiments of the invention, other and further embodiments of the invention may be devised without departing from the basic scope thereof.

What is claimed is:

1. A method for etching a substrate in a plasma etch reactor comprising:
    (a) depositing a polymer on surfaces of a feature formed in a substrate disposed in the etch reactor using a first reactive species formed from a first process gas comprising a polymer forming gas;
    (b) etching the bottom surface of the feature of the substrate in the etch reactor using a third reactive species formed from a third process gas including an etching gas, wherein a composition of gases introduced into the etch reactor changes between (a) and (b); and
    (c) bombarding a bottom surface of the feature with a second reactive species formed from a second process gas comprising one or more of an inert gas, an oxidizing gas, a reducing gas, or the polymer forming gas while at least one of depositing the polymer to remove at least some of the polymer disposed on the bottom surface, wherein a duration of each bombardment of the bottom surface of the feature is about 5 to about 50 percent of a duration of depositing the polymer, or etching the bottom surface to at least one of chemically or physically damage the bottom surface, wherein a duration of each bombardment of the bottom surface of the feature is about 5 to about 50 percent of a duration of etching the bottom surface.

2. The method of claim 1, further comprising:
repeating (a), (b), and (c) until the feature is etched into the substrate to a predetermined depth.

3. The method of claim 1, further comprising:
providing radio frequency (RF) power to the substrate during (a), (b), and (c).

4. The method of claim 1, wherein the substrate further comprises:
a first layer having the feature formed therein; and
a second layer disposed below the first layer, wherein the second layer includes the bottom surface of the feature.

5. The method of claim 4, wherein the first layer is a masking layer and the second layer is a silicon-containing layer.

6. The method of claim 1, wherein the oxidizing gas comprises oxygen ($O_2$) and the inert gas comprises argon (Ar).

7. The method of claim 1, wherein the polymer forming gas comprises a fluorocarbon gas.

8. The method of claim 1, wherein the etching gas is a fluorine-containing gas.

9. The method of claim 1, wherein (c) further comprises:
bombarding the bottom surface of the feature with the second reactive species formed from the second process gas comprising the inert gas and the oxidizing gas while depositing the polymer to remove at least some of the polymer disposed on the bottom surface.

10. The method of claim 9, wherein the first process gas is provided for a first duration and wherein the second process gas is pulsed concurrently with the first process gas.

11. The method of claim 9, wherein the second process gas is provided for a first duration and wherein the first process gas is pulsed concurrently with the second process gas.

12. The method of claim 1, wherein (c) further comprises:
bombarding the bottom surface of the feature with the second reactive species formed from the second process gas comprising the inert gas and at least one of the oxidizing gas or the reducing gas while etching the bottom surface to at least one of chemically or physically damage the bottom surface.

13. The method of claim 12, wherein the second process gas comprises the inert gas and the oxidizing gas.

14. The method of claim 12, wherein the second process gas comprises the inert gas and the reducing gas.

15. The method of claim 12, wherein the second process gas further comprises the polymer forming gas.

16. The method of claim 12, wherein the third process gas is provided continuously for a first duration and wherein the second process gas is pulsed concurrently with the third process gas over the first duration.

17. The method of claim 16, wherein the third process gas further comprises the inert gas and wherein the second process gas is oxygen ($O_2$).

18. A method for etching a substrate in a plasma etch reactor comprising:
(a) depositing a polymer on surfaces of a feature formed in a substrate disposed in the etch reactor using a first reactive species formed from a first process gas comprising a polymer forming gas;
(b) etching the bottom surface of the feature of the substrate in the etch reactor using a third reactive species formed from a third process gas including an etching gas, wherein a composition of gases introduced into the etch reactor changes between (a) and (b); and
(c) bombarding a bottom surface of the feature with a second reactive species formed from a second process gas comprising an inert gas and at least one of an oxidizing gas or a reducing gas while depositing the polymer to remove at least some of the polymer disposed on the bottom surface, about wherein a duration of each bombardment of the bottom surface of the feature is about 5 to about 50 percent of a duration of depositing the polymer.

19. A method for etching a substrate in a plasma etch reactor comprising:
(a) depositing a polymer on surfaces of a feature formed in a substrate disposed in the etch reactor using a first reactive species formed from a first process gas comprising a polymer forming gas;
(b) etching the bottom surface of the feature of the substrate in the etch reactor using a third reactive species formed from a third process gas including an etching gas, wherein a composition of gases introduced into the etch reactor changes between (a) and (b); and
(c) bombarding a bottom surface of the feature with a second reactive species formed from a second process gas comprising an inert gas and at least one of an oxidizing gas or a reducing gas while etching the bottom surface to at least one of chemically or physically damage the bottom surface, wherein a duration of each bombardment of the bottom surface of the feature is about 5 to about 50 percent of a duration of etching the bottom surface.

20. The method of claim 19, wherein the second process gas further comprises the polymer forming gas.

* * * * *